United States Patent [19]

Hastings et al.

[11] Patent Number: 5,340,340

[45] Date of Patent: * Aug. 23, 1994

[54] APPARATUS FOR REMOVABLY SUPPORTING A PLURALITY OF HOT PLUG-CONNECTED HARD DISK DRIVES

[75] Inventors: Robert J. Hastings, Houston; Paily T. Varghese, Tomball; Dennis J. Alexander, Spring; James F. Babb, Houston; John R. Bradshaw, Tomball, all of Tex.

[73] Assignee: Compaq Computer Corporation, Houston, Tex.

[*] Notice: The portion of the term of this patent subsequent to Jan. 11, 2011 has been disclaimed.

[21] Appl. No.: 4,696

[22] Filed: Jan. 14, 1993

Related U.S. Application Data

[63] Continuation-in-part of Ser. No. 950,598, Sep. 24, 1992, Pat. No. 5,277,615.

[51] Int. Cl.⁵ .................... H05K 7/00; A47B 88/00
[52] U.S. Cl. ........................ 439/64; 439/157; 439/928; 439/924; 361/727; 361/730; 312/223.1
[58] Field of Search ............ 439/157, 159, 160, 59, 439/60, 64, 377, 924, 61, 62, 327, 328; 361/391, 393, 394, 727, 730, 928; 29/453; 211/26; 403/323, 380; 312/223.1

[56] References Cited

U.S. PATENT DOCUMENTS

| | | | |
|---|---|---|---|
| 4,377,315 | 3/1983 | Grau | 439/59 |
| 4,537,454 | 8/1985 | Douty et al. | 439/157 |
| 4,574,332 | 3/1986 | Calabro | 439/61 X |
| 4,849,944 | 7/1989 | Matsushita | 439/924 X |

Primary Examiner—Timothy V. Eley
Assistant Examiner—Khan V. Nguyen
Attorney, Agent, or Firm—Konneker Bush Hitt & Chwang

[57] ABSTRACT

A series of hard disk drives are secured atop molded plastic support trays slidably and removably received in opposing guide channel member pairs snap-fitted into opposite side walls of a sheet metal cage structure externally used in conjunction with a file server or other computer device. Snap-fitted into rear end portions of the trays are small printed circuit boards that are insertable into hot plug sockets at the rear of the cage. Forwardly projecting guard plates on the rear end of the cage block manual access to the board/socket interface, and the surface mounted grounding leads on the board extend rearwardly beyond its signal leads to enhance grounding safety during disk drive installation and removal. At the front end of each tray is a vertical support plate upon which LED indicating lights are conveniently mounted for the associated disk drive. Each guide channel member has a metal grounding clip portion that is pressed against the adjacent cage wall and is contacted by grounding portions of the disk drive and support tray as they are slid into the housing. To assist in installing and removing each disk drive, its associated support tray is provided at its front corners with pivotable ejection latch members removably and self-lockingly secured thereto using a molded connection structure that eliminates the requirement for attachment screws or rivets.

18 Claims, 7 Drawing Sheets

APPARATUS FOR REMOVABLY SUPPORTING A PLURALITY OF HOT PLUG-CONNECTED HARD DISK DRIVES

CROSS-REFERENCE TO RELATED APPLICATION

This application is a continuation-in-part of U.S. application Ser. No. 07/950,598 filed on Sept. 24, 1992, now U.S. Pat. No. 5277615.

BACKGROUND OF THE INVENTION

1. Field of the Invention

The present invention relates generally to the mounting and support of hard disk drives for computers, and more particularly relates to apparatus for removably supporting a plurality of hot plug-connected hard disk drives.

2. Description of Related Art

Hard disk drives for a file server or other computer are often mounted, in a vertically spaced array external to the file server, in a rectangular sheet metal "cage" structure within an external disk drive support housing. For operational convenience and flexibility, each disk drive is typically "hot plug" connected within the support housing. This type of electrical connection permits any of the supported disk drives to be removed and re-installed within the support housing without disturbing the operation of the other disk drives.

Under a conventional practice, each disk drive is mounted atop a printed circuit board having a rear card edge portion which is insertable into a back plane hot plug socket within the cage structure. To install each disk drive within the cage, side edge portions of its supporting printed circuit board are inserted into a pair of track members mounted on opposed side wall portions of the cage and then slid rearwardly along the tracks until the rear card edge portion of the circuit board is operatively received its associated hot plug socket at the back of the cage.

Some or all of the following problems, limitations and disadvantages are commonly associated with conventional hot plug disk drive support apparatus of this general type:

1. The use of a printed circuit board to underlie and carry each hard disk drive tends to increase both the complexity and cost associated with removably supporting each disk drive, and additionally presents sharp solder and wire points along the underside of the board which the installer must carefully handle to avoid scratches and nicks in his fingers when installing and removing the disk drive from the cage.

2. On some circuit board-supported disk drives, a considerable amount of manual pulling force is required to disconnect the board from its associated hot plug socket within the cage. On other conventionally supported disk drives, the circuit board is provided with pivotable ejection latches that must be screwed or pinned to the circuit board, thereby increasing the overall complexity and fabricational cost of the support system.

3. A typical method of securing an installed disk drive within the cage is to install a screw in the cage which acts as a stop to prevent removal of the disk drive assembly from the cage. This undesirably complicates and lengthens the individual disk drive installation and removal procedure.

4. Among other grounding-related problems, the necessary grounding between each disk drive and the sheet metal cage in which it is removably supported often requires fairly complex interconnections therebetween which tend to be rather tedious and time consuming to properly utilize. Additionally, the card edge hot plug socket interface area is normally exposed within the cage where it can be inadvertently touched by an installer trying to make alignment or other adjustments within the cage.

5. It is conventional to provide each disk drive with a plurality of indicating lights showing the operative state of the drive. However, under conventional practice, these indicating light arrays typically must be located on the support housing remote from the disk drives. This can lead to visual confusion as to which indicating lights are associated with which disk drive.

It can be seen from the foregoing that it would be desirable to provide external hot plug disk drive support apparatus, of the general type described above, with a variety of operational, fabricational and safety improvements. It is accordingly an object of the present invention to provide hot plug-connected external disk drive support apparatus incorporating such improvements.

SUMMARY OF THE INVENTION

In carrying out principles of the present invention, in accordance with a preferred embodiment thereof, apparatus is provided for removably supporting and providing a hot plug connection for a disk drive such as one of a series of external disk drives used in conjunction with a file server or other computer device. In accordance with various separate aspects the present invention, the preferred embodiment of the apparatus incorporates therein a variety of operational, fabricational and safety improvements.

The overall disk drive support apparatus representatively comprises a housing structure with a sheet metal cage structure disposed therein and having an open front end, a rear end wall having a hot plug socket thereon, first and second opposite side walls extending between the open front end and the rear end wall, and an opposing pair of wall channel portions formed on front ends of the cage structure side walls.

First and second molded plastic guide channel members having open side portions, and generally U-shaped cross-sections along their lengths are mounted on the facing surfaces of the cage structure side walls in a parallel relationship in which the open side portions of the guide channel members face one another, the lengths of the guide channel members are generally transverse to the front wall channel portions of the cage structure, and the guide channel members are in a generally laterally aligned relationship with the hot plug socket.

The disk drive to be supported within the cage structure is removably secured to the top side of a molded plastic support tray having opposite side edges slidably and supportingly receivable in the interiors of the guide channel members in a manner permitting the support tray to be slid rearwardly along the guide channel members to bring the support tray to an operating position within the cage structure.

A printed circuit board is removably mounted on a rear end portion of the support tray in a manner such that when the support tray is rearwardly moved through the cage structure to its operating position therein the circuit board is conductively and removably received within the hot plug socket. Wiring means are provided for electrically coupling the printed circuit board to the disk drive to transmit power thereto from the hot plug socket.

The use of the molded plastic support tray to carry the disk drive, and the use of a relatively small connector circuit board on the rear end of the tray to connect to the hot plug socket reduces the cost of operatively supporting the disk drive, compared to the conventional practice of using a larger printed circuit board to both carry the disk drive and connect it to the hot plug socket, and further provides more user friendly handling characteristics by eliminating the sharp solder and wiring points typically found along the entire underside of the larger circuit board.

Extending rearwardly along a side surface of the small printed circuit board are a spaced series of electrically conductive traces including a grounding trace, a pre-charge trace, a voltage trace connected to the pre-charge trace, and a plurality of signal traces. The grounding trace extends to the rear edge of the circuit board, the rear end of the pre-charge trace is inset from the rear edge of the board, the rear end of the voltage trace is set back further from the rear edge of the board, and the rear ends of the signal traces are set back still further from the rear edge of the board.

Accordingly, when the circuit board is rearwardly plugged into the hot plug socket, the grounding, pre-charge, voltage and signal traces are sequentially engaged by counterpart connector portions within the socket. More specifically, the grounding trace is operatively connected first to the socket, thereby grounding the circuit board before any other electrical connection between the board and plug occurs. Next, the pre-charge trace is electrically coupled to a resistored contact portion in the plug which is operative to inhibit power spikes in the overall system power supply. Then, the voltage trace is electrically coupled to its connector counterpart within the plug. Finally, the signal traces are electrically coupled to their connector counterparts within the plug.

To lessen the possibility of abrasion damage to the connectors within the plug, anti-friction pads are formed on the circuit board side surface in a rearwardly spaced relationship with the pre-charge, voltage and signal traces Preferably, these anti-friction pads are formed from the same electrically conductive material as the traces, and extend to the rear edge of the circuit board.

Projecting upwardly from the front end of the support tray body is a transverse end plate upon which a plurality of disk drive indicating lights are operatively mounted, the wiring means from the circuit board being conveniently routed to the indicating lights via a wire passage formed by wall means on the top side of the support tray body beneath the disk drive.

To assist in inserting and withdrawing the disk drive from the cage structure, ejection latch members are pivotally secured to front corner portions of the support tray and operate in a generally conventional manner, via reactive forces with the front wall channel portions of the cage structure, to exert leveraged insertion and withdrawal forces on tray. According to a feature of the present invention, the latch members are removably secured to the front corner tray portions using a specially designed molded connection structure that eliminates the requirement for attachment screws or rivets and simplifies the fabrication of the overall disk drive support structure.

According to another feature of the invention, the latch members are releasably locked in their closed positions by means of an abutting engagement between stop surfaces on the latch members and facing surfaces of locking tabs extending toward one another from the aforementioned front corner tray portions. In a preferred embodiment of this latching structure, the locking tabs may manually deflected to permit the latch members to be swung outwardly to their opened positions, and the abutting surfaces on the latch members and the locking tabs are sloped at angles that inhibit the latch members from becoming unlocked from their associated tabs unless the tabs are manually depressed.

As a safety feature, the rear end wall of the cage structure has guard wall means projecting forwardly therefrom and operative to block manual access to the printed circuit board when it is adjacent the hot plug socket. For electrostatic discharge purposes, the guide channel members, which are preferably plastic moldings, have snap-fitted thereon sheet metal grounding clips that are deformingly pressed against the metal cage side walls. Grounding screws secured to and projecting outwardly beyond the disk drive are brought into contact with the clips when the tray is rearwardly moved to its operating position within the cage structure, thereby reliably and continuously grounding the inserted disk drive to the metal cage structure.

In addition to this continuous grounding of the installed disk drive, the circuit board is electrostatically discharged as it is being inserted into the cage, and as it is being withdrawn therefrom, by means of side surface solder pads formed on the edge portions of the printed circuit board that slide through the tracks of the guide channel members as the support tray is being inserted into and withdrawn from the cage. As the support tray approaches its associated hot plug socket, these solder pads contact and pass by deformable portions of the grounding clips disposed in the guide channel member tracks, thereby electrostatically discharging the printed circuit board and the electronics of the disk drive. In a similar fashion, as the support tray is withdrawn from the cage, the circuit board pads engage and then pass the deformable grounding clip portions in the guide channel member tracks, again electrostatically discharging the circuit board and the drive electronics.

Inward projections formed on the cage structure side walls are positioned to block these grounding screws, in the event that an attempt is made to rearwardly insert the tray in an upside-down orientation, in a manner preventing the tray from being fully inserted in this improper orientation.

While the various aspects of the present invention summarized above have been described in conjunction with the removable support and hot plug connection of a single disc drive, it will be readily appreciated that by simply using additional hot plug sockets and support components, such as additional guide channel members, support trays and rear end circuit boards, grounding clips, etc., a spaced array of disk drives may be removably supported and hot plug-connected within a housing cage structure.

BRIEF DESCRIPTION OF THE DRAWINGS

FIG. 4 is an exploded perspective view of a rear end portion of the support tray structure illustrating the snap-fit installation thereon of a printed circuit board connector member;

DETAILED DESCRIPTION

Figure 1:
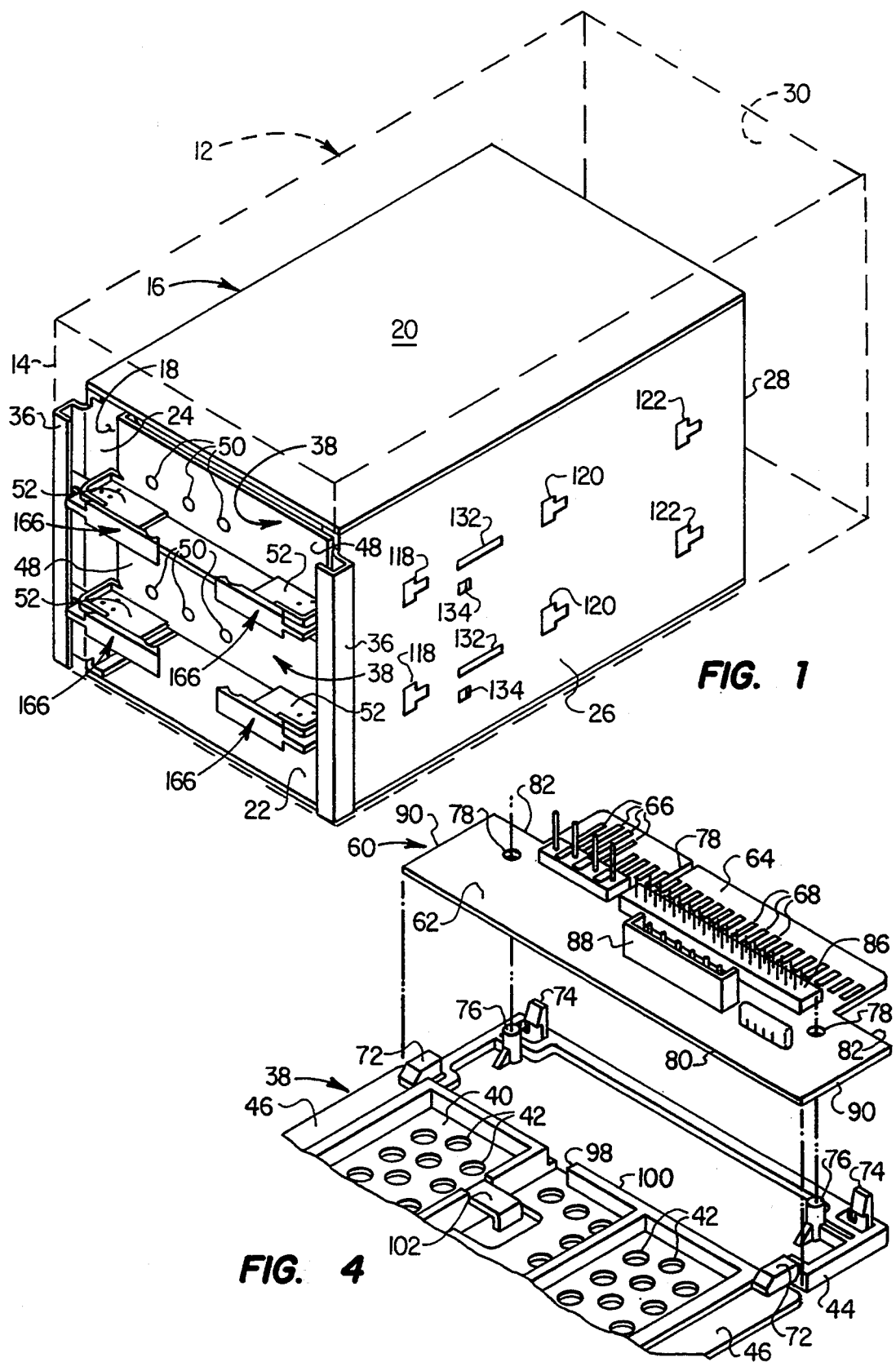
FIG. 1 is a partially phantomed, simplified respective view of a representative external, hot-plug connection hard disk drive support housing structure embodying principles of the present invention.
Figure 2:
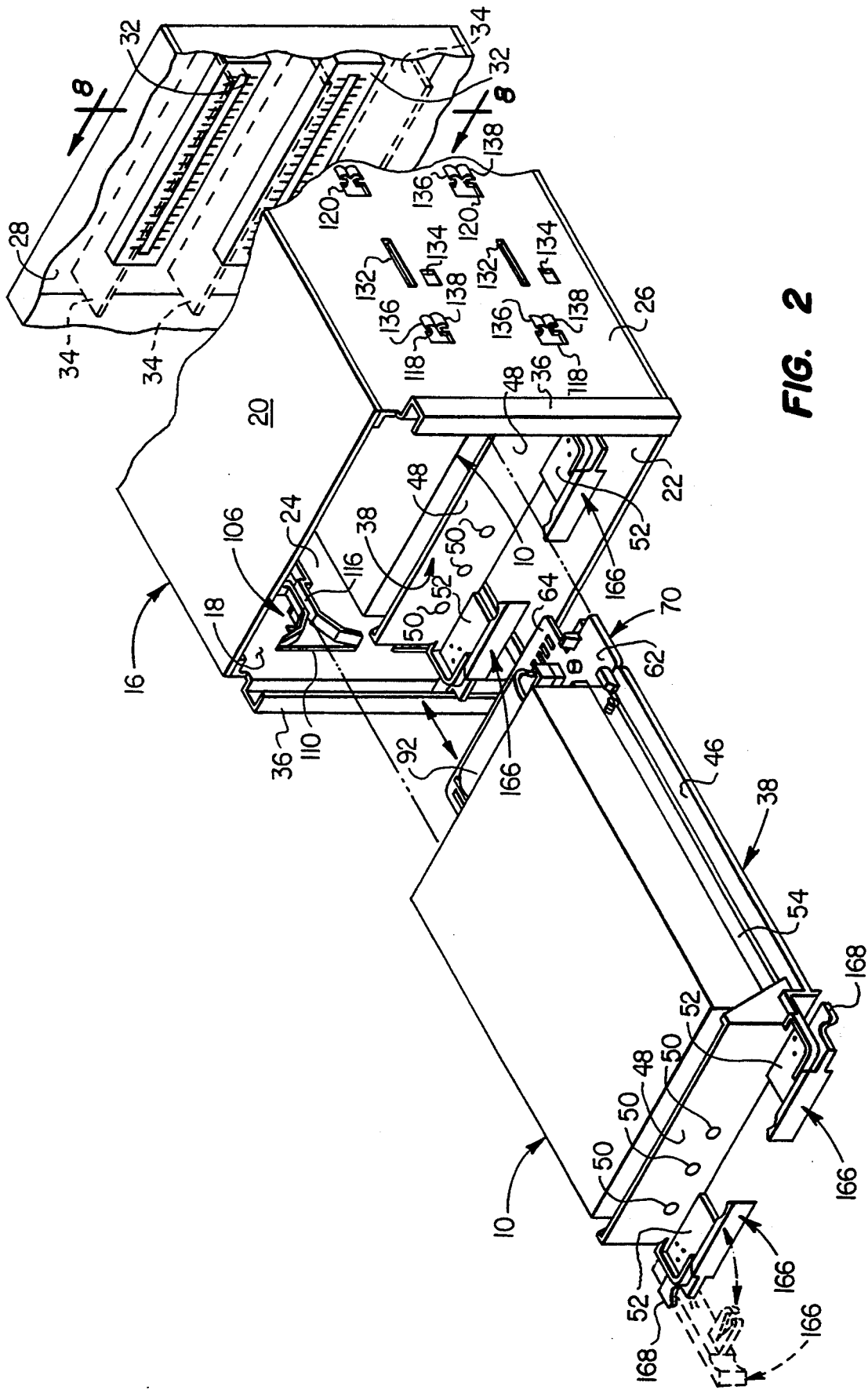
FIG. 2 is an enlarged scale partially exploded fragmentary perspective view of an interior sheet metal cage portion of the housing, with one of the tray-supported disk drives removed therefrom.

Referring initially to FIGS. 1 and 2 of the drawings, in a preferred embodiment thereof the present invention provides apparatus for removably supporting and providing hot plug connections for a vertical spaced plurality of disk drives 10 (FIG. 2) such as those externally utilized in conjunction with a file server (not shown) or other computer device. The support apparatus representatively includes a generally rectangular housing 12 having an open front end 14, and a generally rectangular sheet metal cage structure 16 disposed within the housing.

Cage 16 has an open front end 18 rearwardly adjacent the housing end 14, top and bottom walls 20 and 22, left and right side walls 24 and 26, and a rear end wall 28 spaced inwardly apart from the rear end wall 30 of housing 12. A vertically spaced pair of horizontally elongated hot plug sockets 32 are mounted on the rear cage end wall 28 (FIG. 2). For purposes later described, three vertically spaced, horizontally elongated rectangular guard plate members 34 project forwardly beyond the rear cage end wall 28, with each of the sockets 32 being disposed between and parallel to a vertically adjacent pair of the plates 34. Front end portions of the cage side walls 24,26 are bent to form a pair of vertically extending wall channel portions 36 having generally U-shaped cross-sections along their lengths, and horizontally facing open sides.

Referring now to FIGS. 1–4, each of the disk drives 10 is supported on the top side of one of a specially designed pair of molded plastic support trays 38 each having a generally rectangular body 40. Body 40 has a series of cooling holes 42 formed therethrough; a rear end portion 44 (see FIG. 4); a pair of outwardly projecting opposite side edges 46 rearwardly terminating at rear end portion 44; an upwardly projecting front end plate portion 48 with three LED disk drive activity indicating lights 50 mounted thereon; and a pair of opposite front corner portions 52 projecting outwardly beyond the lower side edge of the front end plate 48.

Each disk drive 10 is of a conventional construction and has a pair of mounting rail sections 54 extending forwardly and rearwardly along opposite lower side portions thereof. For purposed later described, metal grounding screws 56 are connected to and project outwardly from the mounting rails adjacent their rear ends. When each disk drive 10 is operatively mounted atop the body portion 40 of its associated support tray 38, the disk drive is positioned between the plate 48 and the rear end portion 44 of the tray body. Each disk drive 10 is removably secured to its associated support tray 38 by screws 58 extending upwardly through the tray body and threaded into the bottom side of the disk drive.

Mounted atop the rear end portion 44 of each support tray 38 is a small printed circuit board 60 having an elongated rectangular body portion 62 from which a somewhat shorter rectangular plug portion 64 centrally projects in a rearward direction. Plum portion 64 has formed on its top side a series of forwardly and rearwardly extending electrically conductive surface traces including grounding traces 66 and signal traces 68. For purposes later described, the grounding traces 66 extend rearwardly beyond the signal traces 68. A slot 78, parallel to the traces 66 and 68, is formed in the circuit board plug portion 64 and functions in a conventional manner to assure the proper orientation of the plug portion when it is operatively inserted into one of the hot plug sockets 32 as later described.

With reference now to FIG. 4, each circuit board body portion 62 is releasably snap-fitted onto the top of its associated rear support tray end portion 44 by means of a pair of abutment tabs 72 formed on opposite sides of the tray body 40; a pair of upwardly projecting latch portions 74 formed on the rear end of the tray; a pair of upwardly projecting cylindrical post portions 76 formed on the rear tray end portion 44 between the facing abutment and latch pairs 72,74; and a pair of circular holes 78 formed through the circuit board body 62.

Figure 3:
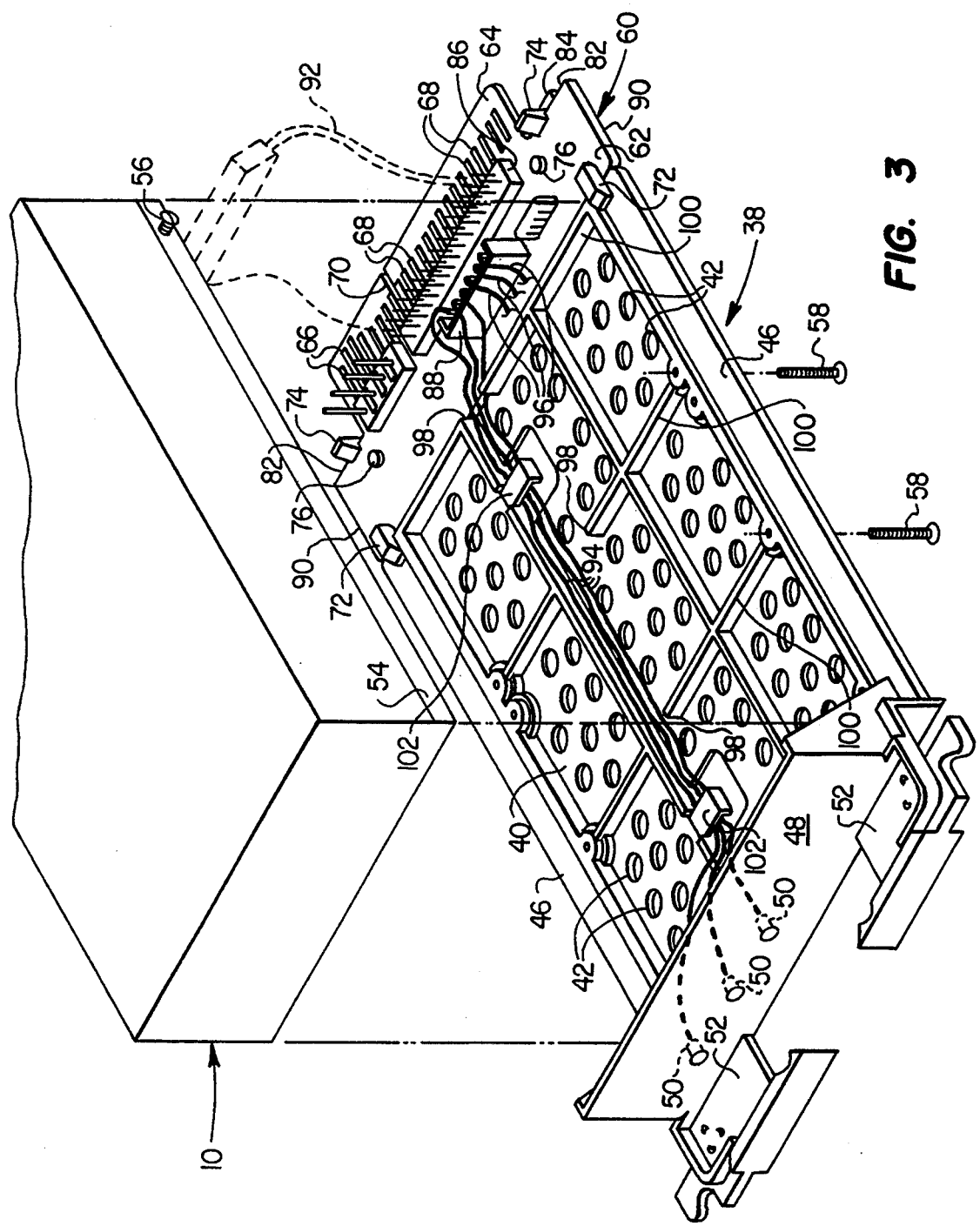
FIG. 3 is an enlarged scale partially exploded perspective view of the removed FIG. 2 disk drive and its underlying support tray structure.

As may be seen by comparing FIGS. 3 and 4, the circuit board 60 is removably installed on the rear support tray end portion 44 by inserting a front side edge portion 80 of the circuit board body under the abutment tabs 72 and then downwardly pivoting the circuit board 60 to cause the posts 76 to upwardly enter the circuit board body holes 78. As the circuit board is pivoted downwardly to its operative position on the support tray, rear side edge portions 82 of the circuit board body rearwardly deflect the latch portions 74 until hooked upper end portions thereof forwardly snap over top side portions of the circuit board body (see FIG. 3) to releasably lock the circuit board on the rear end portion of the support tray 38.

With the circuit board 70 releasably mounted on the support tray 38 in this manner, the posts 76 preclude edgewise movement of the circuit board relative to the support tray so that the posts 76 resist in shear the insertion and removal loads imposed on the circuit board as its plug portion 64 is pushed into and pulled out of its associated hot plug socket 32 as later described. To protect the latch portions 74 against excessive rearward bending, due to installation forces or other forces exerted thereon, a protective abutment wall section 84 is formed on the rear tray end portion 44 a short distance behind and around the outer side of each latch portion 74. These abutment walls 84 act as stops to limit the rearward deflection of each latch portion 74, and as guards to protect the latch portions from damage.

As best illustrated in FIG. 3, with the circuit board 70 mounted on the support tray 38, opposite end edge portions 90 of the circuit board body 62 define rearward continuations of the side edge portions 46 of the support tray 38. To provide for operative wiring interconnections between the circuit board 70, the disk drive 10, and the indicating lights 50, various connector pin sections, such as the illustrated pin sections 86 and 88, are mounted on the circuit board body 62.

Pin section 86 is operatively connected to the rear end of the mounted disk drive 10 by a conventional ribbon cable 92, pin section 88 is operatively connected to the indicating lights 50 by wires 94 (see FIG. 3), and pin section 88 is operatively connected to the underside of the disk drive 10 by wires 96. The wires 94,96 are conveniently routed to the indicating lights 50 and the underside of the disk drive 10 through a wire passage disposed on the top side of the support tray body 40 and generally defined by notches 98 formed in transverse stiffening rib portions 100 of the support tray body, and holding tab portions 102 that overlie the routed wiring.

Figure 5:
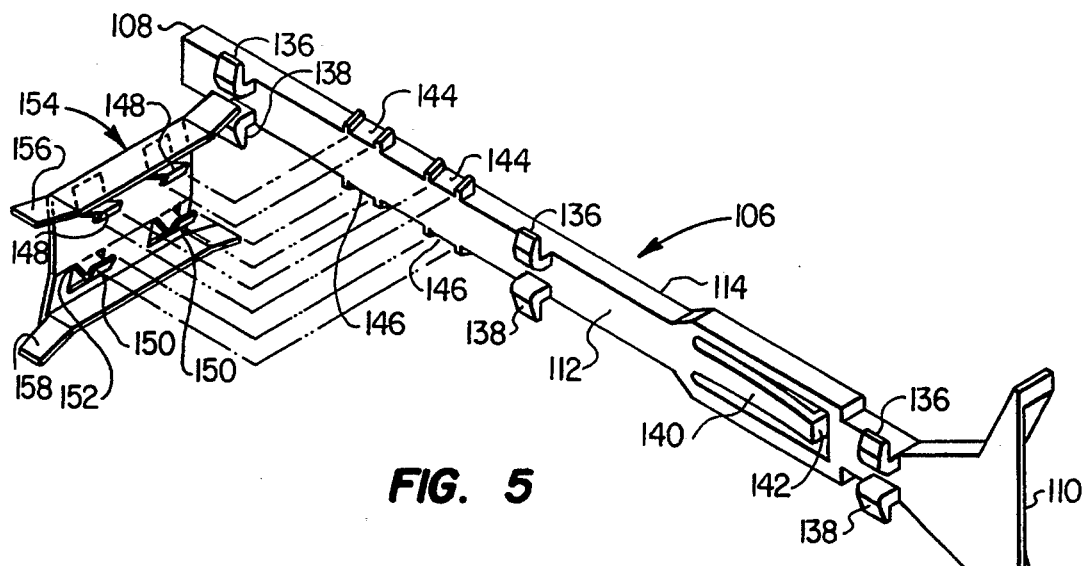
FIG. 5 is an exploded outer side perspective view of a specially designed support rail structure used to slidably carry the disk drives within the cage.
Figure 6:
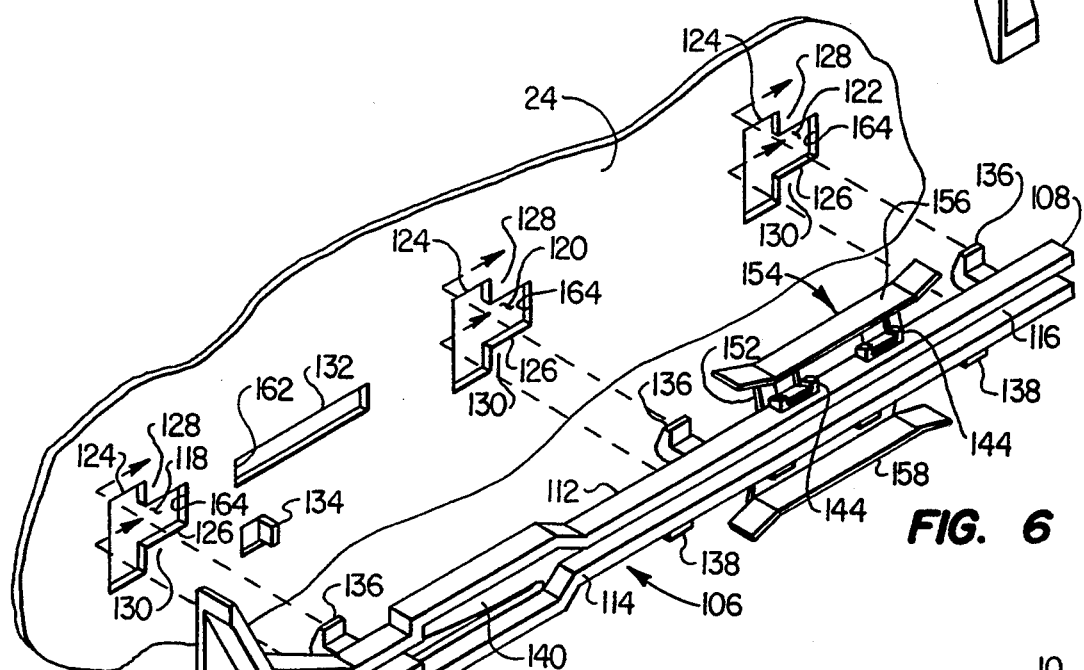
FIG. 6 is an exploded perspective view of the support rail structure and a side wall portion of the cage, and illustrates the snap-fit connection between the support rail structure and the cage wall.

Referring now to FIGS. 2, 5 and 6, the support trays 38 are slidably and removably mounted within the cage structure 16 by means of four molded plastic guide channel members 106, one of which is visible in FIG. 2 and perspectively illustrated in FIGS. 5 and 6. Each guide channel member 106 has an elongated configuration; a rear end 108; a transversely enlarged front end 110; an outer side 112; an inner side 114; and a generally U-shaped cross-section along its length. The cross-sectional configuration of each guide channel member 106 defines therein a longitudinally extending channel or track 116 that laterally opens through the inner side 114 of the member and vertically widens at the front end of the member to facilitate the slidable insertion therein of a circuit board end edge portion as later described.

The four guide channel members 106 are arranged in an upper pair removably secured in a parallel, laterally opposing relationship to the inner sides of the cage side walls 24 and 26, and a lower pair removably secured in a parallel, laterally opposing relationship to the inner sides of the cage side walls 24 and 26. Guide channel members 106 are releasably snap-fitted onto the cage side walls 24,26 using upper and lower horizontal rows of generally T-shaped openings 118,120,122 formed in each of the cage side walls 24 and 26 (see FIGS. 1, 2 and 6).

As best illustrated in FIG. 6, each of the side wall openings 118,120,122 has a vertically enlarged front end portion 124, and a rear end portion 126 that is vertically narrowed by upper and lower portions 128,130 or the particular cage side wall. For purposes later described, horizontally elongated rectangular openings 132 are formed in the cage side walls 24,26 between each pair of openings 118 and 120, and inturned side wall tab portions 134 are positioned beneath the front ends of the openings 132.

Formed on the outer side of each of the guide channel members 106, and projecting outwardly therefrom, are three longitudinally spaced pairs of upwardly and downwardly extending holding tabs 136 and 138. Between the front two sets of tabs 136,138 the guide channel member has formed thereon a horizontally elongated, inwardly deflectable resilient latch portion 140 laterally projecting outwardly beyond the outer side surface 112 of the guide channel member and having a front end surface 142.

Between its rear two pairs of tabs 136,138 each guide channel member 106 has two longitudinally spaced pairs 144,146 of ribbed outward projections formed on its top and bottom side edge surfaces. These projections have removably snap-fitted thereon clip member pairs 148,150 projecting inwardly from the outwardly bowed body portion 152 of a resiliently deformable sheet metal grounding clip member 154 positioned on the outer side of the guide channel member as illustrated in FIGS. 5 and 6. Projecting inwardly from the top and bottom side edges of the grounding clip member 154, and respectively overlying the top and bottom side edges of the guide channel member 106, are top and bottom side portions 156 and 158. As illustrated, side portion 156 has upturned front and rear ends, and side portion 158 has downturned front and rear ends.

As representatively illustrated in FIG. 6, each guide channel member 106 is removably snap-fitted onto its associated cage side wall (for example, the illustrated left cage side wall 24) by first outwardly inserting the three tab pairs 136,138 into the enlarged front portions 124 of the side wall openings 118,120,122 as indicated by the dashed arrows in FIG. 6, and pressing the guide channel member against the interior surface of the cage side wall. This initial insertion and pressing causes the latch portion 140 to be engaged and inwardly depressed by the side wall 24, and also resiliently bends the clip member body portion 152 against the side wall 24.

With the guide channel member 106 pressed against the cage side wall, the guide channel member is then rearwardly slid along the side wall until the latch portion 140 snaps outwardly into the side wall opening 132. This releasably locks the guide channel member in place on the cage side wall, the front end surface 142 of the latch portion 140 rearwardly overlying the front end surface 162 of the side wall opening 132 and preventing forward movement of the guide channel member relative to the cage, and the rear edge portions of the tab pairs 136,138 abutting the rear end surfaces 164 of the side wall opening portions 126 and preventing rearward movement of the guide channel member relative to the cage.

Each guide channel member 106 may be quickly removed from the cage 16 simply by depressing the latch portion 140 from the outside of the cage, forwardly sliding the guide channel member along the inner surface of its associated cage side wall, and then removing the tab pairs 136,138 from the front end portions 124 of the side wall openings 118,120 and 122. The configuration of each guide channel member 106 makes it reversible—i.e., each guide channel member may be operatively installed on either of the cage side walls 24 and 26. For example, the illustrated FIG. 2 guide channel member 106 installed on the left cage side wall 24 can be alternately installed on the right cage side wall 26 simply by removing the guide channel member from the left side wall, rotating the removed guide channel member 180° about its longitudinal axis, and then snapping the guide channel into place on the right cage side wall 26.

With the two horizontally opposed pairs of guide channel members 106 operatively installed on the inner sided of the cage side walls 24,26 as described above, the two tray-mounted disk drives 10 may simply be pushed into place within the cage 16 by inserting opposite end edge portions of the circuit board body portions 62 into the track portions of the upper and lower opposing guide channel pairs and rearwardly sliding the circuit board and tray edge portions along the tracks until the circuit board portions 64 are operatively hot-plugged into their associated sockets 32 at the rear end of the cage. Either of the disk drives 10 may be removed from the cage, without disturbing the operation of the other disk drive, by simply pulling the disk drive rearwardly out of the cage.

Figure 7:
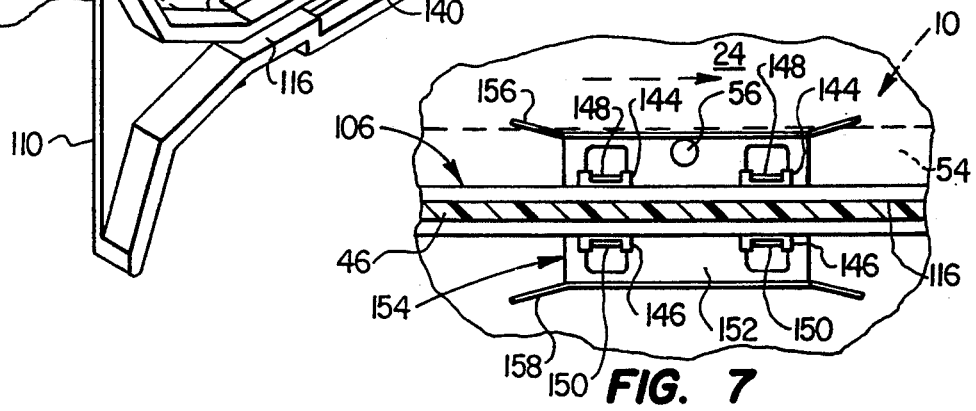
FIG. 7 is a schematic cross-sectional view through one of the support tray structures illustrating the operation of a grounding clip portion of one of its associated support rail structures.

Referring now to FIG. 7, as each of the disk drives 10 rearwardly reaches its operating position within the cage 16, the grounding screws 56 projecting outwardly from opposite sides of the disk drive slide under and upwardly engage the upper side portions 156 of the resilient sheet metal grounding clips 154 on the two guide channel members 106 that slidingly support the inserted disk drive. This engagement between the grounding screws 56 and the upper grounding clip side portions 156 forms secure and reliable electrical grounding connections between the disk drive and the metal cage structure via the grounding screws and the grounding clips. It should be noted that if the guide channel member 106 shown in FIG. 7 was installed on cage side wall 26 instead of the illustrated cage wall 24, the clip member side portion 158, and not the side portion 156, would be engaged by one of the grounding screws 56.

In addition to their electrical grounding function, the two metal grounding screws 56 attached to the opposite sides of each of the disk drives 10 provide another useful function in the overall disk drive support apparatus of the present invention—they cooperate with the inturned cage side wall projections 134 (FIG. 6) to prevent the full rearward insertion of either disk drive into the cage in the event that the disk drive is in an improper upside-down orientation Specifically, if either disk drive is turned upside-down and then inserted into the cage, the two disk drive 56 strike and are rearwardly stopped by an associated opposing pair of the inturned side wall portions 134, thereby preventing further rearward insertion of the improperly oriented disk drive into the cage. In turn, this prevents the disk drive circuit board 70 from improperly engaging its associated hot plug socket 32.

Figure 8:
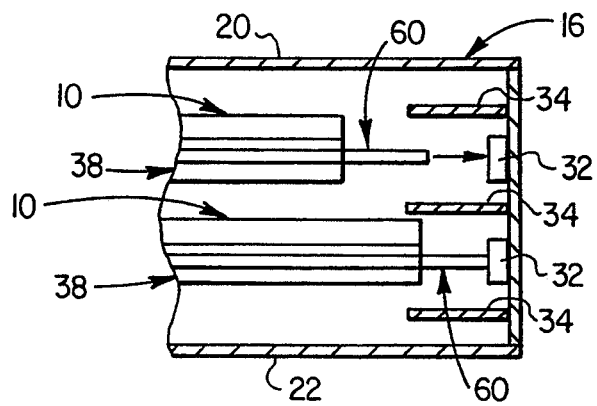
FIG. 8 is a schematic cross-sectional view through a rear end portion of the cage taken along line 8—8 of FIG. 2 and illustrating the operation of a spaced series of forwardly projecting safety guard plates therein.

Referring now to FIG. 8 it can be seen that as each of the disk drives 10 rearwardly reaches its operative position in which its circuit board 60 is fully inserted into its associated hot plug socket 32, a pair of the forwardly projecting guard plates 34 come into play to block both upper and lower manual access to the circuit board as it approaches its associated hot plug socket, the circuit board passing between the two guard plates as it approaches the socket.

Referring now to FIGS. 1, 2 and 9A–9D, the manual pushing and pulling forces on the support trays 38 necessary to respectively insert their circuit board portions into the hot plug sockets, and remove their circuit board portions from the sockets, are desirably lessened by the use of pairs of ejection latch members 166 pivotally secured to the front corner portions 52 of the support trays 38. As representatively illustrated in FIG. 2, each ejection latch member 166 is pivotable relative to its associated tray corner portion 52 between an outwardly pivoted dotted line release position and an inwardly pivoted solid line locking position. The inner ends of the latch members 166 are provided with hook portions 168 that extend into the interiors of the wall channel portions 36 of the cage structure 16.

In a conventional manner, when a given pair of latch members 166 are manually pivoted outwardly from their solid line positions (when their associated disk drive is in its operatively inserted position within the cage) their hook portions 168 bear against the interiors of the channel wall portions 36 in a manner forcibly moving the disk drive rearwardly to unplug its circuit board from its associated hot plug socket. When the latch members 166 are fully pivoted outwardly to their dotted line positions, their hook portions 168 are automatically removed from the wall channel portions 36, thereby permitting the disc drives to be slid rearwardly out of the cage.

Conversely, when one of the disk drives 10 is slid partially into the cage with its latch members 166 in their dotted line positions, to bring the hook portions 168 into alignment with their associated wall channel portions 36, inward pivoting of the latch members 166 from their dotted line positions to their solid line positions causes the hook portions to enter the wall channel portions 36 and then bear against them in a manner forcing the support tray circuit board 60 rearwardly into its associated hot plug socket 32.

Although the general operation of the ejection latch members 166 is conventional, they are pivotally and removably secured to the support tray corner portions 52 in a unique manner that avoids the necessity using of connecting screws or rivets, and which will now be described in conjunction with FIGS. 9A–9D.

Projecting outwardly from the underside of each of the support tray corner portions 52 are a cylindrical boss 170; an inwardly depressible resilient latch portion 172 having an outer end surface 174; and a cylindrical post 176 having a circular outer end portion 178 from which three circumferentially and equally spaced projections 180 radially outwardly extend.

The illustrated ejection latch member 166 has a connection plate portion 182 from which the hook portion 168 outwardly extends. Extending outwardly from the plate portion 182 in the opposite direction is a lever plate section 184. Lever plate section 184 has an inner side surface 186 from which a laterally spaced pair of elongated resilient latch portions 188 outwardly extend, outer end sections of the latch portions 188 having facing arcuate notches 190 formed therein.

A hole 192 is formed transversely through the connection plate portion 182 and is complementarily configured relative to the upper post end 178, the hole having three circumferentially spaced radially outwardly projecting portions through which the upper post end projections 180 may be passed when the upper post end projections 180 and the hole portions 194 are circumferentially aligned.

Figure 9A:
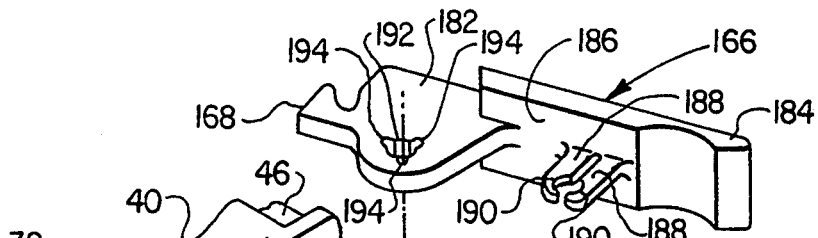
FIGS. 9A–9D are bottom side perspective views of a rear corner portion of one of the disk drive support trays and sequentially illustrate the unique installation and operation thereon of an ejection latch member utilized to facilitate the installation and removal of a disk drive into and from the cage.

Each ejection latch member 166 is pivotally and removably installed on the underside of its associated support tray corner portion 52 in the following manner. Referring first to FIG. 9A, the latch member 166 is oriented as shown so that its connection plate hole 192 is positioned outwardly from the outer post end portion 175 in a manner such that the hole portions 194 are circumferentially aligned with the post end projections 180.

Figure 9B:
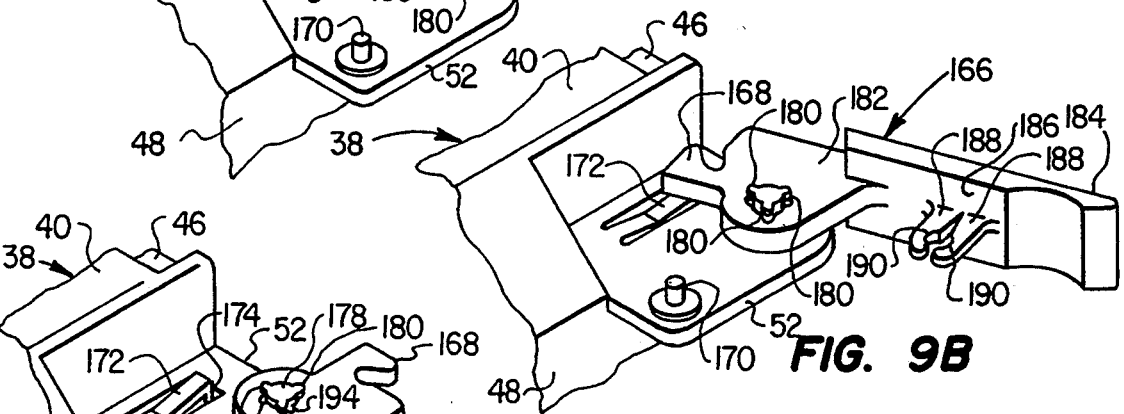

Next, as depicted in FIG. 9B, the latch member connection plate portion 182 is moved inwardly toward and pressed against the underside of the corner portion 52 to cause the post projections 180 to pass through the hole portions 194 and outwardly overlie the connection plate portion 182. With the connection plate portion 182 in its FIG. 9B orientation it contacts and inwardly depresses the corner portion latch 172.

Figure 9D:
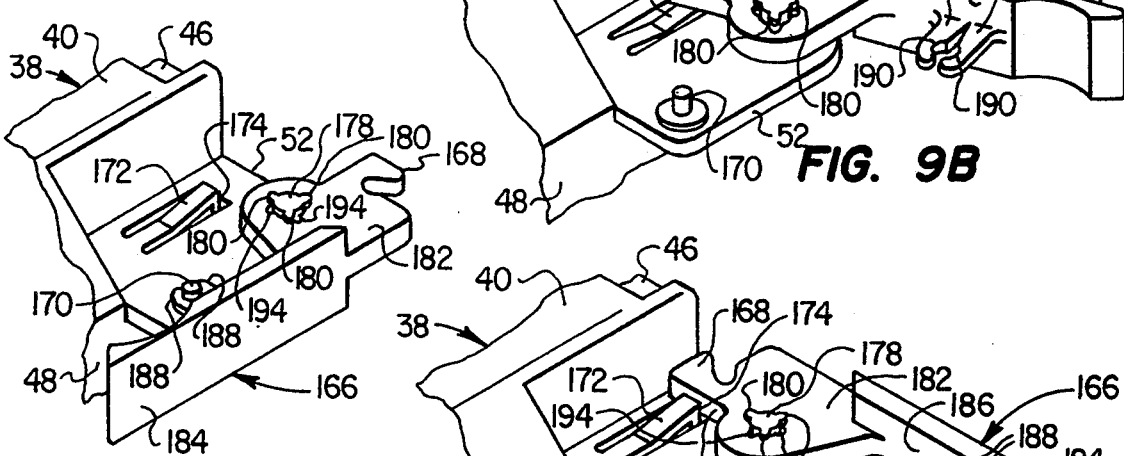
Figure 9C:
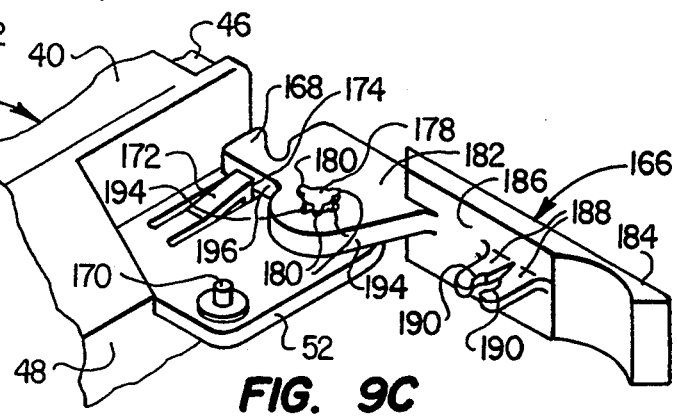

While the connection plate portion 182 is held against the support tray corner portion 52, the latch member 166 is rotated a short distance about post 176 in a clockwise direction to move the plate hole portions 194 out of circumferential alignment with the post projections 180 as shown in FIG. 9C. At this point, in which the latch member 166 is in its dotted line position shown in FIG. 2, the latch portion 172 pops back up so that its end surface 174 faces the plate portion edge surface 196, and the latch member 166 is pivotally and captively retained on the support tray corner portion 52.

It can be seen that, due to the latch end abutment surface 174, the latch member cannot be pivoted in a counterclockwise direction past its FIG. 9C position, to align the hole portions 194 with the post end portions 180 and permit removal of the connecting plate portion 182 from the post 176, unless the latch portion 172 is manually depressed and the latch 166 pivoted back to its FIG. 9B position.

From its FIG. 9C open position the latch member 166 may be pivoted in a clockwise direction to its FIG. 9D closed position in which the boss 170 is received within and releasably held between the arcuate notches 190 in the latch portions 188. At this point the latch member is still captively retained on the post 176 since the hole portions 194 have not been rotated far enough to be brought into alignment with the post end portions 180.

The latch member may be quickly removed from the post 176 simply by rotating the latch member in a counterclockwise direction to its FIG. 9C position, manually depressing the latch 172 and further rotating the latch member to its FIG. 9B position, and then lifting the connecting plate portion 182 off the post 176.

Figure 10A:
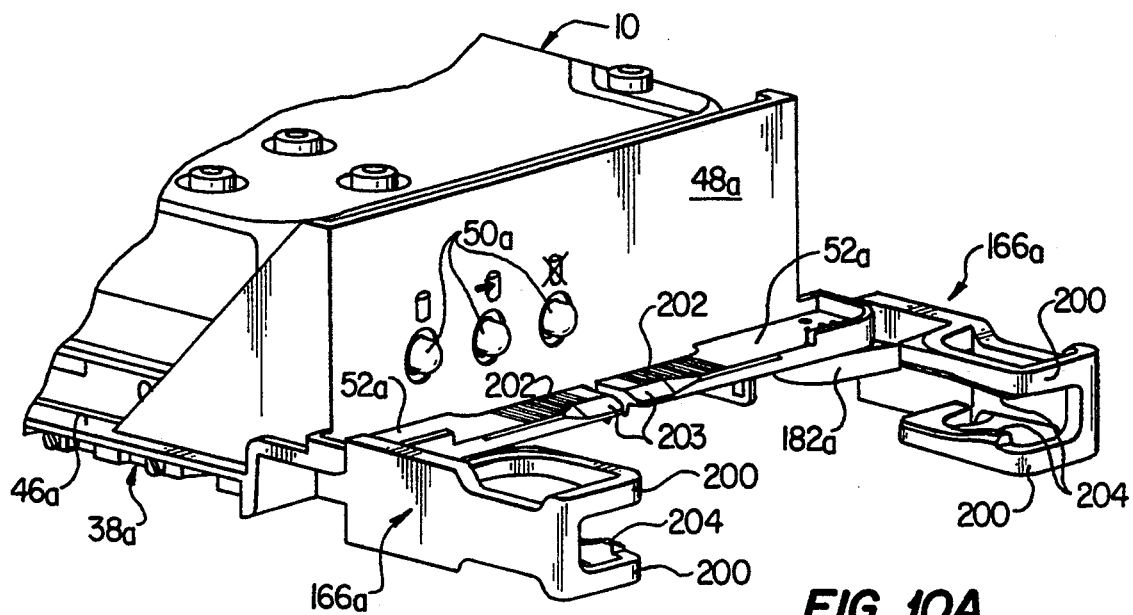
FIGS. 10A and 10B are perspective views of a front end portion of an alternate embodiment of one of the disk drive support trays illustrating a modified latching system thereon in its opened and closed orientations, respectively.
Figure 10B:
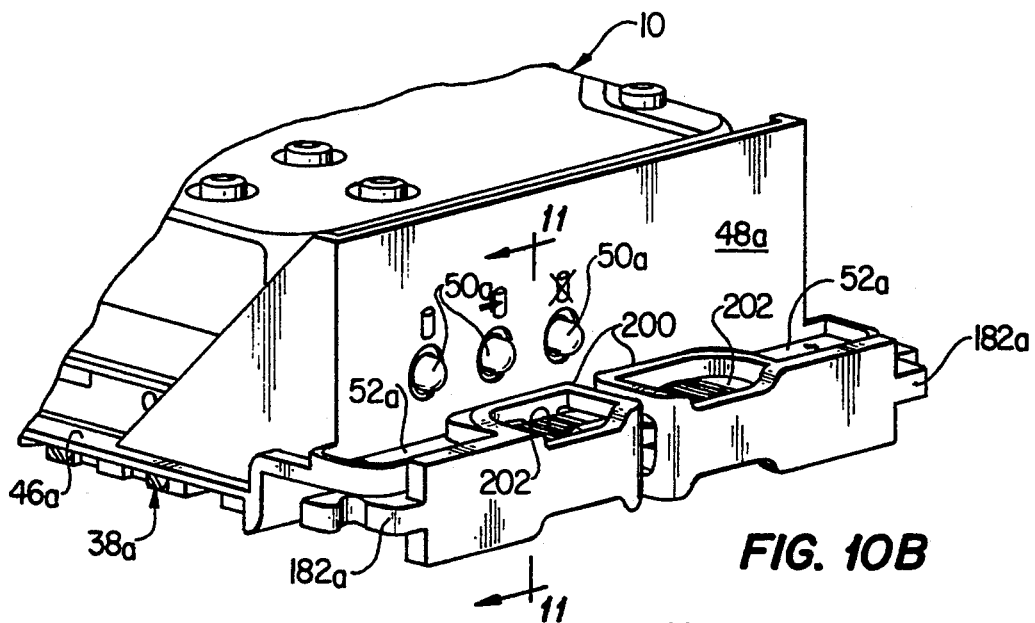
Figure 11:
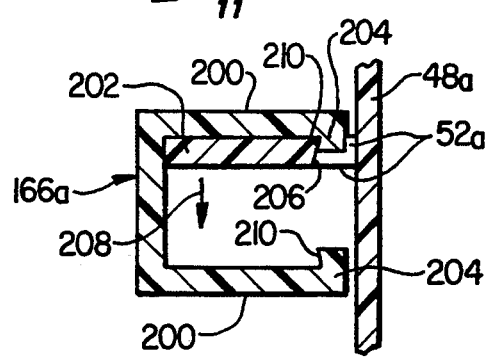
FIG. 11 is an enlarged scale, simplified partial cross-sectional view through a portion of the modified latching system taken along line 11—11 of FIG. 10B.

An alternate embodiment 38a of the previously described support tray 38 is depicted in FIGS. 10A, 10B and 11. For ease in comparing the support tray 38a to support tray 38, the components of tray 38a similar to those on tray 38 have been given identical reference numerals, but with the subscripts "a".

In the front end latching mechanism on support tray 38a the connection plate portions 182a are pivotally secured to the front corner portions 52a of the tray body as previously described in conjunction with FIGS. 9A–9D. The interlocking cylindrical bosses 170 and latch portions 188 shown in FIGS. 9A-9D are deleted from this embodiment of the support tray structure. The latching function of these deleted components is replaced by vertically spaced, generally U-shaped projections 200 formed on the inner sides of the modified ejection lever members 166a, and a pair of resiliently deflectable locking tab portions 202 formed on the tray body corner portions 52a and extending horizontally toward one another in an outwardly spaced relationship with the front end plate 48a of the support tray. For purposes later described, the top side surfaces of the tabs 202 are provided with downwardly and forwardly sloped portions 203.

At the inner sides each opposing pair of the projections 200 are transverse side portions 204 that extend toward one another. As the ejection lever members 166a are pivoted from their FIG. 10A opened positions to their FIG. 10B closed positions the top transverse side portions 204 of the ejection lever members 166a engage the sloped top side surface portions 203 of the locking tabs 202, cams the tabs 202 downwardly, and then snap into place behind the rear side edges 206 of the tabs 202 as best illustrated in FIG. 11.

This releasably locks the ejection lever members 166a in their closed positions illustrated in FIG. 10B. To release the ejection lever members 166a, and permit them to be outwardly pivoted to their FIG. 10A opened positions, the locking tabs 202 are simply pushed downwardly, as indicated by the arrow 208 in FIG. 11, to permit the top transverse side portion 204 to upwardly clear its associated locking tab 202.

It should be noted that the facing side surfaces 206 and 210 on the locking tabs 202 and the upper transverse side portions 204 provide a positive abutment lock between the tabs and the ejection lever members 166a. To further facilitate this abutment lock, the rear side surfaces 206 of the locking tabs 202 are slanted downwardly and forwardly (preferably at an angle of about five degrees) relative to the tray body end wall 48a as best illustrated in FIG. 11.

In a similar fashion, the side surfaces 210 of the upper ejection lever member projections 200 are sloped parallel to the side surfaces 206 which they face. This slight sloping of the facing side surfaces 206,210 assists in preventing unintentional unlocking of the ejection lever members 166a from the locking tabs 202 in the event that a leftward force is exerted on the ejection lever members (as viewed in FIG. 11) during, for example, shipping and handling of the assembled housing, cage and disk drive unit. The side surface 210 of the lower projection 200 is sloped forwardly and upwardly at the same approximately five degree angle. This permits either of the ejection lever members 166a to be operatively installed on either of the front corner portions 52a of the support tray body.

Figure 12:
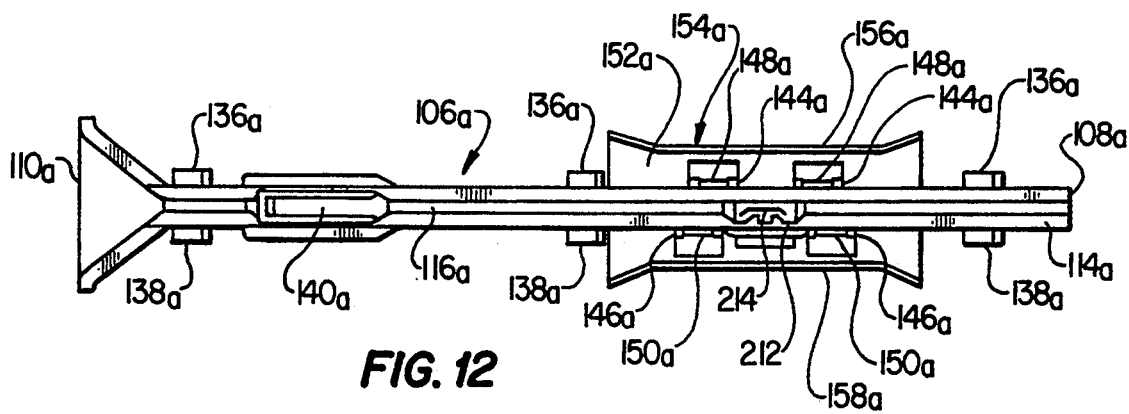
FIG. 12 is an outer side elevational view of an alternate embodiment of the support rail structure of FIG. 5.

Illustrated in FIG. 12 is an alternate embodiment 106a of the previously described guide channel member 106 shown in FIGS. 5 and 6. For ease in comparing the modified guide channel member 106a to the guide channel member 106, components in the guide channel member 106a similar to those in guide channel member 106 have been given identical reference numerals, but with the subscripts "a". The modified guide channel member 106a is used in conjunction with a modified circuit board 60a (see FIG. 14) that snaps into place on the rear end of the support tray body in the place of the previously described circuit board 60. For ease in comparing the modified circuit board 60a to the originally described circuit board 60, components in circuit board 60a similar to those in the circuit board 60 have also been given identical reference numerals, but with the subscripts "a".

Figure 13:
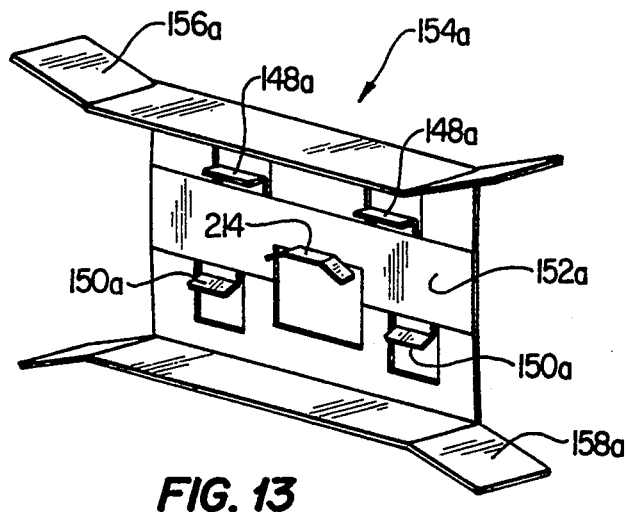
FIG. 13 is an enlarged scale perspective view of a grounding clip portion of the support rail structure of FIG. 12.

For reasons subsequently described, in the guide channel member 106a an opening 212 is formed through the plastic body portion of the guide channel member 106a and extends through its track 116a between the lower projections 146a. As illustrated, the opening 212 has a lower side portion that is recessed into the lower side boundary wall of the track 116a. Additionally, the lower projections 146a are spaced further apart than the upper projections 144a. The metal grounding clip 154a is also modified relative to the previously described grounding clip 154 in that, in the grounding clip 154a, the lower projections 150a (see FIG. 13) are spaced further apart than the upper projections 148a, and the grounding clip 154a is provided with a central projection 214 having downturned front and rear end portions.

When the modified grounding clip member 154a is snapped into place on the plastic body of the guide channel member 106a, the upper clip projections 148a snap into the upper body projections 144a, the lower clip projections 150a snap into the lower body projections 146a, and the central clip projection 214 is received in the body opening 212 and extends across the track 116a.

Figure 14:
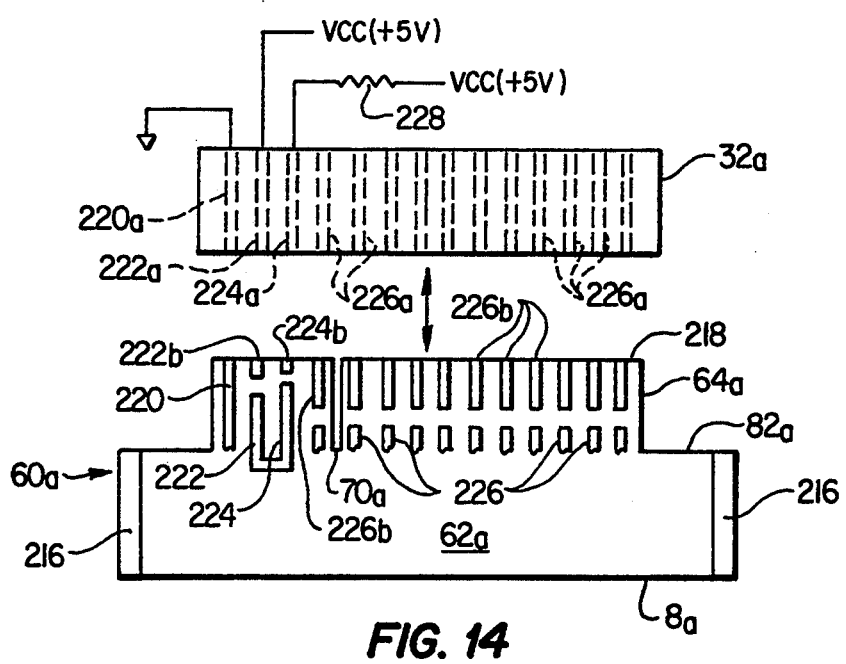
FIG. 14 is a highly schematic top plan view of an alternate embodiment of the printed circuit board connector member shown in FIGS. 3 and 4, together with a hot plug socket to which it is operatively connectable, with certain connector portions of the printed circuit board having been removed therefrom for purposes of illustrative clarity.

Referring now to FIG. 14, the opposite ends of the body portion 62a of the printed circuit board 60a have rectangular solder pads 216 formed on their top and bottom sides. As the support tray 38a (see FIG. 10A) is operatively slid into the cage, the ends of the printed circuit board body portion 62a (as previously described for the support tray 38) slide rearwardly through the tracks 116a of its associated pair of guide channel members 106a. As the opposite ends of the circuit board body portion 62a reach the central clip projection 214, the solder pads 216 on the lower sides of these opposite ends slide across the top side of the central projection 214, thereby electrostatically discharging the circuit board 60a and the disk drive electronics. The solder pads then rearwardly pass, and become disengaged from the central clip member projection 214. At this point the grounding screws 56 (see FIGS. 3 and 7) are brought into engagement with the top clip member side portion 156 and remain in engagement therewith while the disk drive 10 is operatively connected to its associated hot plug at the back of the cage. When the disk drive is later removed from the cage, the solder pads again wipe across the central clip member projection 214 to electrostatically discharge the circuit board 60a and the disk drive electronics.

It will be appreciated that in the guide channel member 106a which opposes the guide channel 106a illustrated in FIG. 12 the clip member portion 154a will be flipped over relative to the illustrated clip member portion 154a so that its projections 148a will be below its projections 146a, and the opposite end portions of its central projection 214 will be upturned instead of downturned. Accordingly, when the opposite ends of the circuit board body portion 62a are slid through the tracks 116a of the opposing guide channel members 106a a top side solder pad 216 on one end of the circuit board body 62a will wipe across one of the central grounding clip member projections 214, while the bottom side solder pad 216 on the other end of the circuit board body 62a will wipe across the other central grounding clip member projection 214.

It can also be seen that the fact that the spacing between the lower guide channel member projections 146a is greater than the spacing between the upper guide channel member projections 144a (see FIG. 12) prevents the clip member 154 from being inadvertently reversed on its associated guide channel member body in a manner 10 causing the bent ends on the clip member central projection 214 to project into the track 116a (thereby blocking the passage of the circuit board body end portions through the track) instead of properly extending into the recessed side of the guide channel member body opening 212 as shown in FIG. 12.

Returning now to FIG. 14, in addition to the provision of the solder pads 216 on the body 62a of the printed circuit board 60a it is further modified compared to the circuit board 60 as will now be described.

Spaced apart along the length of the plug portion 64a of the circuit board 60a (which is operatively insertable into the illustrated hot plug 32a), and extending along its top side surface toward its rear side edge 218 are a series of electrically conductive traces. From left to right as viewed in FIG. 14 these traces include a grounding trace 220, a voltage trace 222, a pre-charge trace 224 connected to trace 222, and a series of signal traces 226.

Disposed within the hot plug 32a for respective engagement with the traces 220,222,224,226 are a ground connector 220a coupled to ground, a voltage connector 222a coupled to a +5V VCC, a pre-charge connector 224a coupled to the +5V VCC through a resistor 228, and a series of signal connectors 226a. As illustrated the grounding trace 220 extends to the rear side edge 218 of the circuit board plug portion 64a, the rear end of the pre-charge tract 224 is rearwardly inset from the side edge 218, the rear end of the voltage trace 222 is further inset from the side edge 218, and the rear ends of the signal traces 226 are still further inset from the rear side edge 218 of the plug portion 64a of the circuit board 60a.

Accordingly, when the plug portion 64a of the circuit board 60a is inserted into the hot plug 32a the progressive rearward staggering of the pre-charge trace 224, the voltage trace 222 and the signal traces 226 results in a trace/connector coupling sequence in which (1) the grounding trace 220 is first coupled to its associated grounding connector 220a; (2) the pre-charge trace 224 is then coupled to its associated pre-charge connector 224a; (3) the voltage trace 222 is then coupled to its associated voltage connector 222a; and (4) the signal traces 226 are then simultaneously coupled to their associated signal connectors 226a.

Accordingly, the circuit board 60a is grounded before any power or signal connections are made thereto. Additionally, the operative electrical connection of the pre-charge trace 224 prior to the electrical connection to the voltage trace 222 serves to prevent disruptive power spikes in the power supply to the multiple disk drive system. It will be appreciated that upon withdrawal of the circuit board plug section 64a from the hot plug 32a, the trace disconnection sequence is reversed relative to their connection sequence so that the trace/connector grounding connection is broken last.

To substantially inhibit abrasion wear on the contactor portions 222a,224a,226a arising from repeated insertions and withdrawals of the circuit board plug portion 64a into and from the hot plug 32a, a series of anti-friction pad sections 222b,224b,226b are formed on the top side of the circuit board plug portion 64a respectively to the rear of the traces 222,224,226.

As illustrated, the rear ends of the pads 222b,224b,226b are disposed at the rear side edge 218 of the circuit board plug portion 62a, and their front ends are spaced generally equally short distances rearwardly of their associated traces 222,224,226. Pads 222b,224b,226b are thus respectively aligned with the connectors 222a,224a,226a. Pads 222b,224b,224c are preferably formed from the same electrically conductive material as the traces 220,222,224,226 (for example, gold), and serve to prevent abrasive contact between the circuit board substrate and the connectors 220a,222a,224a,226a.

While the disk drive support apparatus representatively described above provides hot plug connections for the disk drives, it will readily be appreciated by those skilled in this art that it could also be employed using non-hot plug socket connections for the disk drives if desired.

The foregoing detailed description is to be clearly understood as being given by way of illustration and example only, the spirit and scope of the present invention being limited solely by the appended claims.

What is claimed is:

1. Apparatus for supporting and providing a plug connection for a disk drive, comprising:
   a housing cage structure having an open front end, a rear end wall having a plug socket thereon, and first and second opposite side walls extending between said open front and said rear and wall and having facing surfaces,
      said plug socket having a spaced series of connectors therein including a grounding connector, a resistored pre-charge connector connectable to a voltage source, a voltage connector connectable to said voltage source, and a plurality of signal connectors;
   first and second elongated guide channel members having open side portions, interiors, and generally U-shaped cross-sections along their lengths;
   means for mounting said guide channel members on the facing surfaces of said first and second side walls in a parallel relationship in which said open side portions of the mounted first and second guide channel members face one another and said first and second guide channel members longitudinally extend towards said plug socket in a generally laterally aligned relationship therewith;
   a support tray member having opposite side edge portions slidably and supportingly receivable in the interiors of said first and second guide channel members in a manner permitting said support tray member to be slid rearwardly along said first and second guide channel members to bring said support tray member to an operating position within said cage structure, said support tray member having a rear end portion and a top side portion disposed forwardly of said rear end portion;
   a printed circuit board having a plug portion with a wide surface and a rear edge, said printed circuit board being removably mounted on said rear end portion of said support tray member in a manner such that when said support tray member is rearwardly moved through said cage structure to said operating position said plug portion of said printed circuit board is removably received within said plug socket, said plug portion side surface having formed thereon a series of electrically conductive traces mutually spaced apart in a direction parallel to said plug portion rear edge and including:
   a grounding trace engageable with said grounding connector and having a rear end,
   a pre-charge trace engageable with said pre-charge connector and having a rear end forwardly offset from said rear end of said grounding trace,
   a voltage trace engageable with said voltage connector and connector to said pre-charge trace, said voltage trace having a rear end forwardly offset from said rear end of said pre-charge trace, and
   a plurality of signal traces engageable with said signal connectors, said signal traces having rear ends forwardly offset from said rear end of said voltage trace;
   means for removably securing a disk drive to said top side portion of said support tray member for movement therewith; and
   means for electrically coupling said printed circuit board to the disk drive.

2. The apparatus of claim 1 wherein:
   said rear end of said grounding trace is positioned generally at said rear edge of said printed circuit board plug portion, and
   said apparatus further comprises a series of anti-friction pads formed on said side surface of said printed circuit board plug portion in alignment with said pre-charge, voltage and signal traces, said anti-friction pads having rear ends positioned generally at said rear edge of said printed circuit board plug portion and front ends spaced rearwardly apart from the rear ends of said pre-charge, voltage and signal traces.

3. The apparatus of claim 2 wherein:
   said anti-friction pads are formed from an electrically conductive material.

4. The apparatus of claim 3 wherein:
   the electrically conductive material of said anti-friction pads is identical to that of said series of electrically conductive traces.

5. The apparatus of claim 1 wherein:
   said plug socket is a hot plug socket.

6. Apparatus for supporting and providing a plug connection for a disk drive, comprising:
   a housing cage structure having an open end, a rear end wall having a plug socket thereon, first and second opposite side walls extending between said open end and said rear end wall and having facing surfaces, and opposing channel portions formed on said open front end and extending parallel to said opposite side walls;
   first and second elongated guide channel members having open side portions, interiors, and generally U-shaped cross-sections along their lengths;
   means for mounting said guide channel members on the facing surfaces of said first and second side walls of said housing cage structure in a parallel relationship in which said open side portions of the mounted first and second guide channel members face one another and said first and second guide channel members longitudinally extend toward said plug socket in a generally laterally aligned relationship therewith;

a support tray member having opposite front corners portions, and side edge portions slidably and supportingly receivable in the interiors of said first and second guide channel members in a manner permitting said support tray member to be slid rearwardly along said first and second guide members to bring said support tray member to an operating position within said cage structure, said support tray member having a rear end portion and a top side portion disposed forwardly of said rear end portion;

a printed circuit board;

means for removably mounting said printed circuit board on said rear end portion of said support tray member for movement therewith in a manner such that when said support tray member is rearwardly moved through said cage structure to said operating position a rear portion of the mounted printed circuit board is conductively and removably received within said plug socket;

means for removably securing a disk drive to said top side portion of said support tray member for movement therewith;

means for electrically coupling said printed circuit board to the disk drive;

a pair of ejection lever members pivotally mounted on said opposite front corner portions of said support tray member for movement relative thereto between opened and closed positions, said ejection lever members being operative, when pivoted relative to said front corner portions, to engage said cage structure front end channel portions in a manner selectively creating an insertion or withdrawal force on said support tray member; and cooperatively interengageable locking means on said ejection lever members and said support tray member for releasably holding said ejection lever members in said closed position thereof.

7. The apparatus of claim 6 wherein:
said cooperatively interengageable locking means are operative in response to movement of said ejection lever members from said opened positions thereof to said closed positions thereof.

8. The apparatus of claim 7 wherein said cooperatively interengageable locking means include:
resiliently deflectable locking members carried by said front corner portions of said support tray member and having rearwardly facing first abutment surfaces, and
locking projections formed on said ejection lever members and having second abutment surfaces thereon, said locking members and locking projections being relatively configured and positioned in a manner such that as said ejection lever members are pivotally moved to said closed positions thereof said locking projections engage and deflect said locking members; until said second abutment surfaces are positioned rearwardly of said first abutment surfaces and then permit said locking members to return to their original undeflected positions to position said first abutment surfaces in opposing relationships with said second abutment surfaces.

9. The apparatus of claim 8 wherein:
said locking members extend toward one another from said front corner portions of said support tray member.

10. The apparatus of claim 9 wherein:
said locking members have tapered side surface portions positioned and configured to facilitate the deflection of said locking members by said locking projections.

11. The apparatus of claim 8 wherein:
said locking projections have openings therein permitting manual access to said locking members to manually deflect them in a manner permitting said ejection lever members to be pivoted from said closed positions thereof to said opened positions thereof.

12. The apparatus of claim 8 wherein, when said ejection lever members are in said closed positions thereof, said first and second abutment surfaces, relative to said support tray member, are sloped downwardly and forwardly at relatively small, generally identical angles.

13. The apparatus of claim 12 wherein:
said angles are approximately 5 degrees.

14. The apparatus of claim 6 wherein:
said plug socket is a hot plug socket.

15. Apparatus for supporting and providing a plug connection for a disk drive, comprising:
a housing cage structure having an open front end, a rear end wall having a plug socket thereon, and first and second opposite side walls extending between said open front end and said rear end wall and having facing surfaces;

first and second elongated guide channel members having open side portions, interiors, and generally U-shaped cross-sections along their lengths;

means for mounting said guide channel members on the facing surfaces of said first and second side walls in a parallel relationship in which said open side portions of the mounted first and second guide channel members face one another and said first and second guide channel members longitudinally extend toward said plug socket in a generally laterally aligned relationship therewith;

a support tray member having opposite side edge portions slidably and supportingly receivable in the interiors of said first and second guide channel members in a manner permitting said support tray member to be slid rearwardly along said first and second guide channel members to bring said support tray member to an operating position within said cage structure, said support tray member having a rear end portion and a top side portion disposed forwardly of said rear end portion;

a printed circuit board;

means for removably mounting said printed circuit board on said rear end portion of said support tray member for movement therewith in a manner such that when said support tray member is rearwardly moved through said cage structure to said operating position a rear portion of the mounted printed circuit board is conductively and removably received within said plug socket;

means for removably securing a disk drive to said top side portion of said support tray member for movement therewith;

means for electrically coupling said printed circuit board to the disk drive;

sheet metal grounding clip members carried by said guide channel members and deformingly pressed against said first and second side walls of said housing cage structure; and cooperatively engageable means on said printed circuit board and said grounding clip members for temporarily grounding said printed circuit board as said support tray member is being moved through said cage structure toward and away from said operating position.

16. The apparatus of claim 15 wherein:

said printed circuit board has opposite edge portions positioned to be moved through the interiors of said first and second guide channels as said support tray member is moved through said housing cage structure, each of said opposite edge portions of said printed circuit board having a side surface portion, and said cooperatively engageable means include an electrically conductive material disposed on said side surface portions of said opposite edge portions of said printed circuit board, openings formed transversely through said first and second guide channels and extending into their interiors, and grounding contact portions of said grounding clip members extending through said openings into the interiors of said first and second guide channel members and positioned to be slidingly and temporarily engaged by said electrically conductive material as said support tray member is moved through said housing cage structure.

17. The apparatus of claim 16 further comprising:

metal grounding members secured to and projecting outwardly beyond opposite side portions of the mounted disk drive, said metal grounding members being configured and positioned to releasably engage said grounding clip members when said support tray member is rearwardly brought to said operating position thereof within said housing cage structure to thereby continuously ground the disk drive while said printed circuit board is operatively connected to said plug socket.

18. The apparatus of claim 15 wherein:

said plug socket is a hot plug socket.

* * * * *